(12) United States Patent
Karda et al.

(10) Patent No.: US 9,478,550 B2
(45) Date of Patent: Oct. 25, 2016

(54) ARRAYS OF VERTICALLY-ORIENTED TRANSISTORS, AND MEMORY ARRAYS INCLUDING VERTICALLY-ORIENTED TRANSISTORS

(75) Inventors: Kamal M. Karda, Boise, ID (US); Shyam Surthi, Boise, ID (US); Wolfgang Mueller, Garden City, ID (US); Sanh D. Tang, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/595,854

(22) Filed: Aug. 27, 2012

(65) Prior Publication Data

US 2014/0054718 A1   Feb. 27, 2014

(51) Int. Cl.
| | | |
|---|---|---|
| *H01L 27/105* | (2006.01) | |
| *H01L 27/10* | (2006.01) | |
| *H01L 27/108* | (2006.01) | |
| *H01L 21/765* | (2006.01) | |

(52) U.S. Cl.
CPC ....... *H01L 27/10876* (2013.01); *H01L 21/765* (2013.01); *H01L 27/10855* (2013.01)

(58) Field of Classification Search
CPC ............. H01L 21/765; H01L 29/1083; H01L 29/0696; H01L 29/66636; H01L 21/76224; H01L 27/10876; H01L 27/10885; H01L 27/108; H01L 29/66666; H01L 29/7827; H01L 27/10841; H01L 29/7926; G11C 7/18
USPC ....... 257/135, 136, 208, 242, 329, 372, 386, 257/394, 396, 397
See application file for complete search history.

(56) References Cited

U.S. PATENT DOCUMENTS

| | | |
|---|---|---|
| 3,562,022 A | 2/1971 | Shifrin |
| 3,865,624 A | 2/1975 | Wilde |
| 4,673,962 A | 6/1987 | Chatterjee et al. |
| 4,764,394 A | 8/1988 | Conrad |
| 4,829,018 A | 5/1989 | Wahlstrom |
| 4,920,390 A | 4/1990 | Fuse et al. |
| 5,374,456 A | 12/1994 | Matossian et al. |
| 5,508,212 A | 4/1996 | Wang et al. |
| 5,627,390 A | 5/1997 | Maeda et al. |
| 5,672,541 A | 9/1997 | Booske et al. |

(Continued)

FOREIGN PATENT DOCUMENTS

| | | |
|---|---|---|
| KR | 10-2004-0055142 | 6/2004 |
| TW | 102127877 | 4/2015 |

(Continued)

OTHER PUBLICATIONS

U.S. Appl. No. 12/914,346, filed Nov. 1, 2010, Heineck et al.

(Continued)

*Primary Examiner* — Dale E Page
*Assistant Examiner* — John Bodnar
(74) *Attorney, Agent, or Firm* — Wells St. John, P.S.

(57) ABSTRACT

An array includes vertically-oriented transistors. The array includes rows of access lines and columns of data/sense lines. Individual of the rows include an access line interconnecting transistors in that row. Individual of the columns include a data/sense line interconnecting transistors in that column. The array includes a plurality of conductive lines which individually extend longitudinally parallel and laterally between immediately adjacent of the data/sense lines. Additional embodiments are disclosed.

25 Claims, 13 Drawing Sheets

(56) References Cited

U.S. PATENT DOCUMENTS

| | | | |
|---|---|---|---|
| 5,828,094 A | 10/1998 | Lee | |
| 5,897,363 A | 4/1999 | Gonzalez et al. | |
| 6,137,713 A | 10/2000 | Kuroda et al. | |
| 6,221,724 B1 | 4/2001 | Yu et al. | |
| 6,225,151 B1 | 5/2001 | Gardner et al. | |
| 6,329,686 B1 | 12/2001 | Lowrey et al. | |
| 6,417,040 B2 | 7/2002 | Noble | |
| 6,492,245 B1 | 12/2002 | Liu et al. | |
| 6,504,201 B1 | 1/2003 | Noble et al. | |
| 6,563,162 B2 | 5/2003 | Han et al. | |
| 6,582,998 B2 | 6/2003 | Nitta | |
| 6,593,612 B2 | 7/2003 | Gruening et al. | |
| 6,600,191 B2 | 7/2003 | Lowrey et al. | |
| 6,639,846 B2 | 10/2003 | Nikutta | |
| 6,689,660 B1 | 2/2004 | Noble et al. | |
| 6,716,727 B2 | 4/2004 | Walther | |
| 6,977,417 B2 | 12/2005 | Momiyama et al. | |
| 6,992,349 B2 | 1/2006 | Lee et al. | |
| 7,012,021 B2 | 3/2006 | Ang et al. | |
| 7,015,091 B1 | 3/2006 | Wu | |
| 7,052,941 B2 | 5/2006 | Lee | |
| 7,074,656 B2 | 7/2006 | Yeo et al. | |
| 7,099,174 B2 | 8/2006 | Thompson et al. | |
| 7,129,538 B2 | 10/2006 | Lee et al. | |
| 7,166,479 B2 | 1/2007 | Zhu et al. | |
| 7,179,703 B2 | 2/2007 | Gonzalez et al. | |
| 7,365,384 B2 | 4/2008 | Tran et al. | |
| 7,456,068 B2 | 11/2008 | Kavalieros et al. | |
| 7,491,641 B2 | 2/2009 | Southwick et al. | |
| 7,501,676 B2 | 3/2009 | Doyle | |
| 7,518,182 B2 | 4/2009 | Abbott et al. | |
| 7,592,212 B2 | 9/2009 | Qin et al. | |
| 7,713,823 B2 | 5/2010 | Sung et al. | |
| 7,736,969 B2 | 6/2010 | Abbott et al. | |
| 7,737,010 B2 | 6/2010 | Qin et al. | |
| 7,768,073 B2 | 8/2010 | Wells | |
| 7,939,409 B2 | 5/2011 | Figura et al. | |
| 7,948,064 B2 | 5/2011 | Barth et al. | |
| 7,956,402 B2 | 6/2011 | Chen et al. | |
| 8,008,158 B2 | 8/2011 | Chang et al. | |
| 8,202,781 B2 | 6/2012 | Kim | |
| 2002/0110039 A1 | 8/2002 | Forbes et al. | |
| 2003/0096490 A1 | 5/2003 | Borland et al. | |
| 2003/0107911 A1 | 6/2003 | Nishihara et al. | |
| 2003/0186519 A1 | 10/2003 | Downey et al. | |
| 2004/0132232 A1 | 7/2004 | Noble | |
| 2004/0195594 A1* | 10/2004 | Tran et al. | 257/206 |
| 2005/0017281 A1 | 1/2005 | Lowrey | |
| 2005/0079721 A1 | 4/2005 | Buerger et al. | |
| 2005/0260838 A1 | 11/2005 | Downey et al. | |
| 2006/0017088 A1 | 1/2006 | Abbott et al. | |
| 2006/0043617 A1 | 3/2006 | Abbott | |
| 2006/0059449 A1 | 3/2006 | Yang et al. | |
| 2006/0081884 A1 | 4/2006 | Abbott et al. | |
| 2006/0249770 A1 | 11/2006 | Huo et al. | |
| 2007/0087574 A1 | 4/2007 | Gupta et al. | |
| 2007/0171742 A1* | 7/2007 | Yi | G11O 5/063 365/201 |
| 2007/0243680 A1 | 10/2007 | Harari et al. | |
| 2007/0246783 A1* | 10/2007 | Moon et al. | 257/384 |
| 2007/0295995 A1 | 12/2007 | Yun et al. | |
| 2008/0142931 A1 | 6/2008 | Sasaki et al. | |
| 2008/0217655 A1* | 9/2008 | Baumann et al. | 257/202 |
| 2008/0268628 A1 | 10/2008 | Kohli et al. | |
| 2008/0277738 A1 | 11/2008 | Ananthan | |
| 2009/0121268 A1 | 5/2009 | Lee et al. | |
| 2009/0230466 A1 | 9/2009 | Kim | |
| 2009/0256187 A1 | 10/2009 | Kim | |
| 2010/0038709 A1* | 2/2010 | Wang et al. | 257/329 |
| 2010/0237423 A1* | 9/2010 | Yun et al. | 257/368 |
| 2011/0019486 A1 | 1/2011 | Jang et al. | |
| 2011/0215391 A1 | 9/2011 | Takaishi | |
| 2011/0215408 A1 | 9/2011 | Tang et al. | |
| 2011/0220994 A1 | 9/2011 | Parekh et al. | |
| 2011/0303974 A1* | 12/2011 | Kim | H01L 27/10876 257/329 |
| 2012/0104491 A1 | 5/2012 | Heineck et al. | |
| 2013/0168757 A1 | 7/2013 | Hong | |

FOREIGN PATENT DOCUMENTS

| | | |
|---|---|---|
| WO | WO PCT/US2013/051662 | 11/2013 |
| WO | WO PCT/US2013/051662 | 3/2015 |

OTHER PUBLICATIONS

U.S. Appl. No. 13/031,829, filed Feb. 22, 2011, Guha et al.

Bernstein et al., Effects of Dopant Deposition on p+/n and n+/p Shallow Junctions formed by Plasma Immersion Ion Implantation, IEEE, 2000, 464-467.

Gras-Marti, "Recoil Implantatation Yields and Depth Profiles", Phys. Stat. Sol. (1) 76, 621-627, 1983.

Oh et al.; Characterization of $B_2H_6$ Plasma Doping for Converted p+ Poly-Si Gate, 2006 American Institute of Physics, pp. 25-28.

Qin et al.; Comparative Study of Self-Sputtering Effects of Different Boron-Based Low-Energy Doping Techniques, 2009 IEEE, vol. 37, No. 9, Sep. 2009, pp. 1760-1766.

Dopant Diffusion in C-Doped and Si and SiGe: Physical Model and Experimental Verification; Rucker et al.; Institute for Semiconductor Physics; 1999; 4 pp.

* cited by examiner

ARRAYS OF VERTICALLY-ORIENTED TRANSISTORS, AND MEMORY ARRAYS INCLUDING VERTICALLY-ORIENTED TRANSISTORS

TECHNICAL FIELD

Embodiments disclosed herein pertain to arrays of vertically-oriented transistors and to memory arrays including vertically-oriented transistors.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time, in many instances including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin dielectric. Application of a suitable voltage to the gate allows current to flow from one of the source/drain regions to the other through the channel region. When the voltage is removed from the gate, current is largely prevented from flowing through the channel region. Field-effect transistors may also include additional structure, for example reversibly programmable charge storage regions as part of the gate construction. Transistors other than field-effect transistors, for example bipolar transistors, may additionally or alternately be used in memory cells.

One type of volatile memory is dynamic random access memory (DRAM). Some DRAM memory cells may comprise a field effect transistor coupled with a charge-storage device, such as a capacitor. Other example memory cells may lack capacitors, and instead may use electrically floating transistor bodies. Memory which uses electrically floating transistor bodies to store data may be referred to as zero-capacitor-one-transistor (0C1T) memory, as capacitor-less memory, or as ZRAM™ (zero capacitance DRAM), and may be formed to much higher levels of integration than DRAM.

Regardless, the gates of the transistors may interconnect along rows of the memory cells and form the access lines. The digit or data/sense lines may interconnect with one of the source/drains of each transistor along columns of the memory cells. The data/sense lines may connect with individual sense amplifiers outside of the memory array. Access lines and data/sense lines may be used in memory arrays wherein the individual memory cells include transistors in addition to or other than field effect transistor. Regardless, it is desirable that the data/sense lines be of high conductivity. Further, it is desirable to minimize parasitic capacitance and cross-talk between immediately adjacent data/sense lines.

Transistors may be used in memory other than DRAM and in other than volatile memory. Further, transistors may be formed in arrays other than memory.

DETAILED DESCRIPTION OF EXAMPLE EMBODIMENTS

Figure 1:
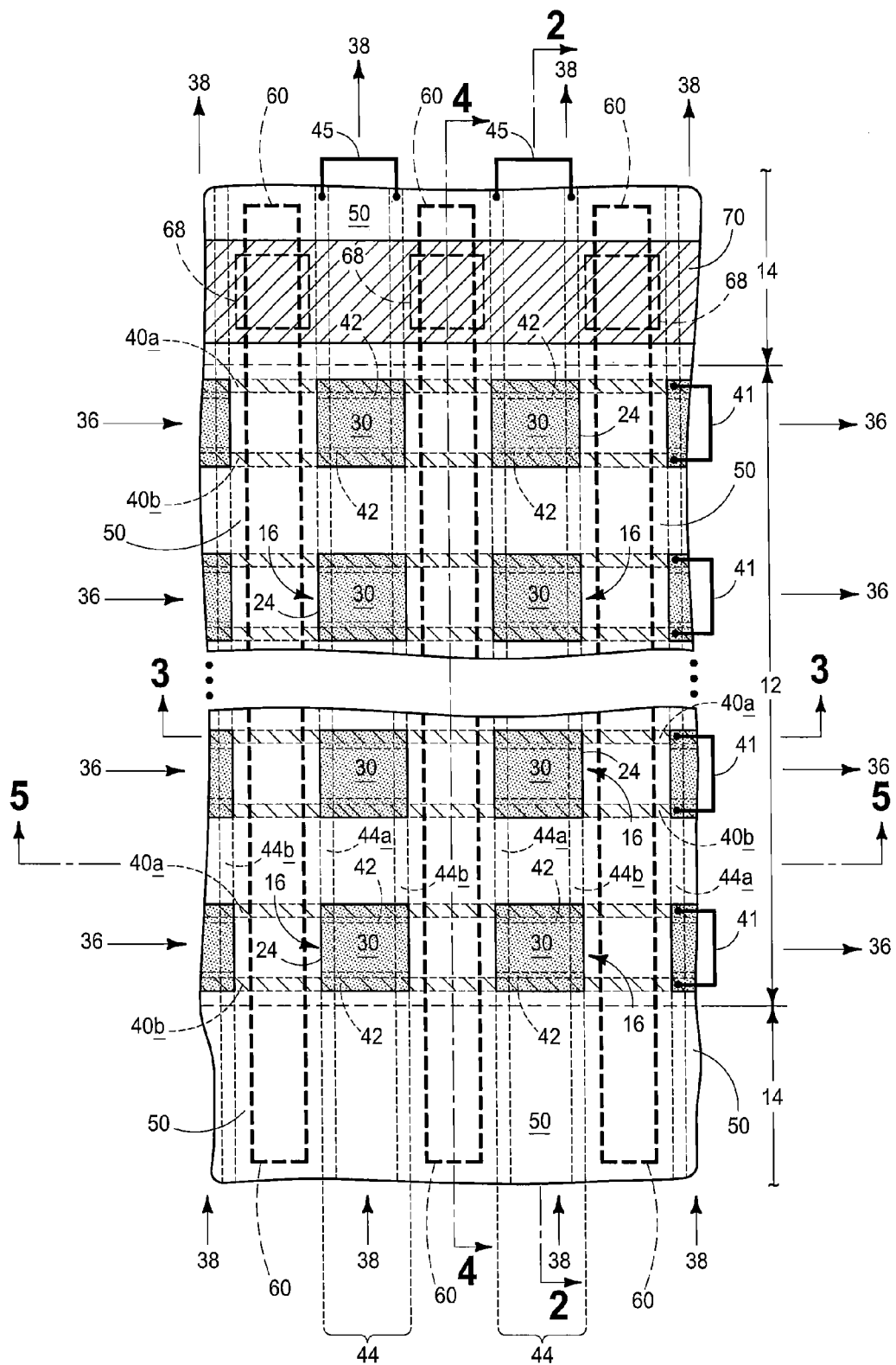
FIG. 1 is a diagrammatic, fragmented, hybrid top plan and schematic view of a substrate fragment comprising an array in accordance with an embodiment of the invention, and which comprises vertically-oriented transistors.

Embodiments of the invention include arrays of vertically-oriented transistors, memory arrays including vertically-oriented transistors, and memory cells which include a vertically-oriented transistor. Example embodiments are initially described with reference to FIGS. 1-5. Such show a substrate fragment 10, for example a semiconductor substrate, comprising an array or sub-array area 12 and circuitry area 14 peripheral to array/sub-array area 12. Array 12 includes an array of vertically-oriented transistors 16. In this document, vertical is a direction generally orthogonal to a primary surface relative to which the substrate is processed during fabrication and which may be considered to define a generally horizontal direction. Further, "vertical" and "horizontal" as used herein are generally perpendicular directions relative one another independent of orientation of the substrate in three-dimensional space. Further in this document, words such as "underlying", "under", "lower", "outward", "beneath", "above", and "elevationally" are relative terms corresponding to the vertical direction with respect to the structure being described. Circuitry may be fabricated outside of array 12 (e.g., in area 14) for operating vertically-oriented transistors 16. Control and/or other peripheral circuitry for operating vertically-oriented transistors 16 may or may not wholly or partially be received within array 12, with an example array as a minimum encompassing all of the vertically-oriented transistors (e.g., which may include memory cells) of a given array/sub-array. Further, multiple sub-arrays may also be fabricated and operated independently, in tandem, or otherwise relative one another. As used in this document, a "sub-array" may also be considered as an array.

In some embodiments, the array comprises memory, for example comprising a plurality of individual memory cells which include a generally vertically-oriented transistor. One example is DRAM, although other existing or yet-to-be-developed volatile and non-volatile memory is contemplated. FIGS. 1-5 by way of example show array 12 as comprising a plurality of memory cells 18 which individually include a transistor 16 and a charge storage device 15 (shown schematically in FIGS. 2 and 3). Charge storage device 15 is shown as being a capacitor, although other storage devices or techniques may be used and which may be formed within and/or above substrate fragment 10.

Figure 2:
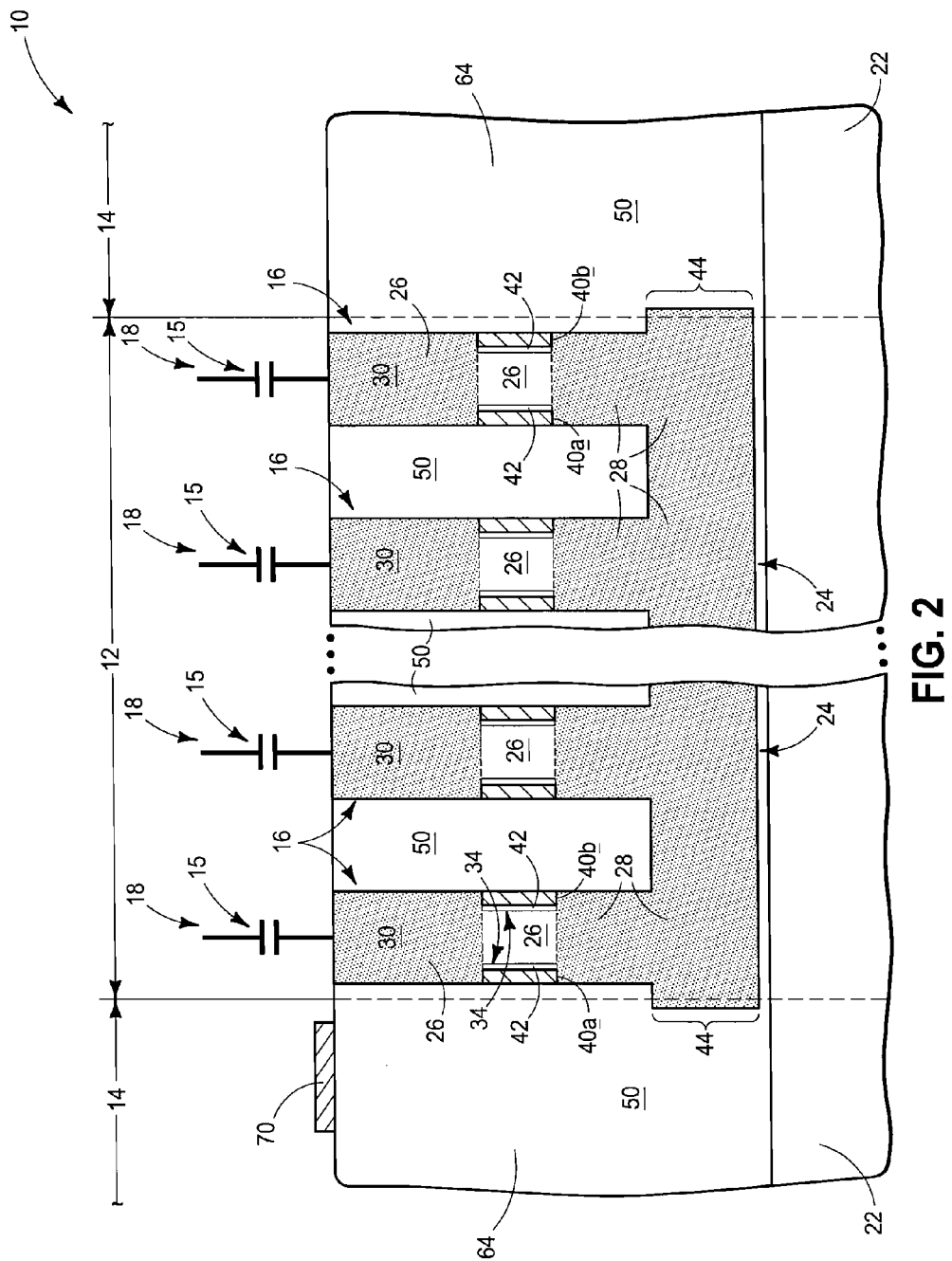
FIG. 2 is a hybrid schematic and structural cross-sectional view taken through line 2-2 in FIG. 1.
Figure 3:
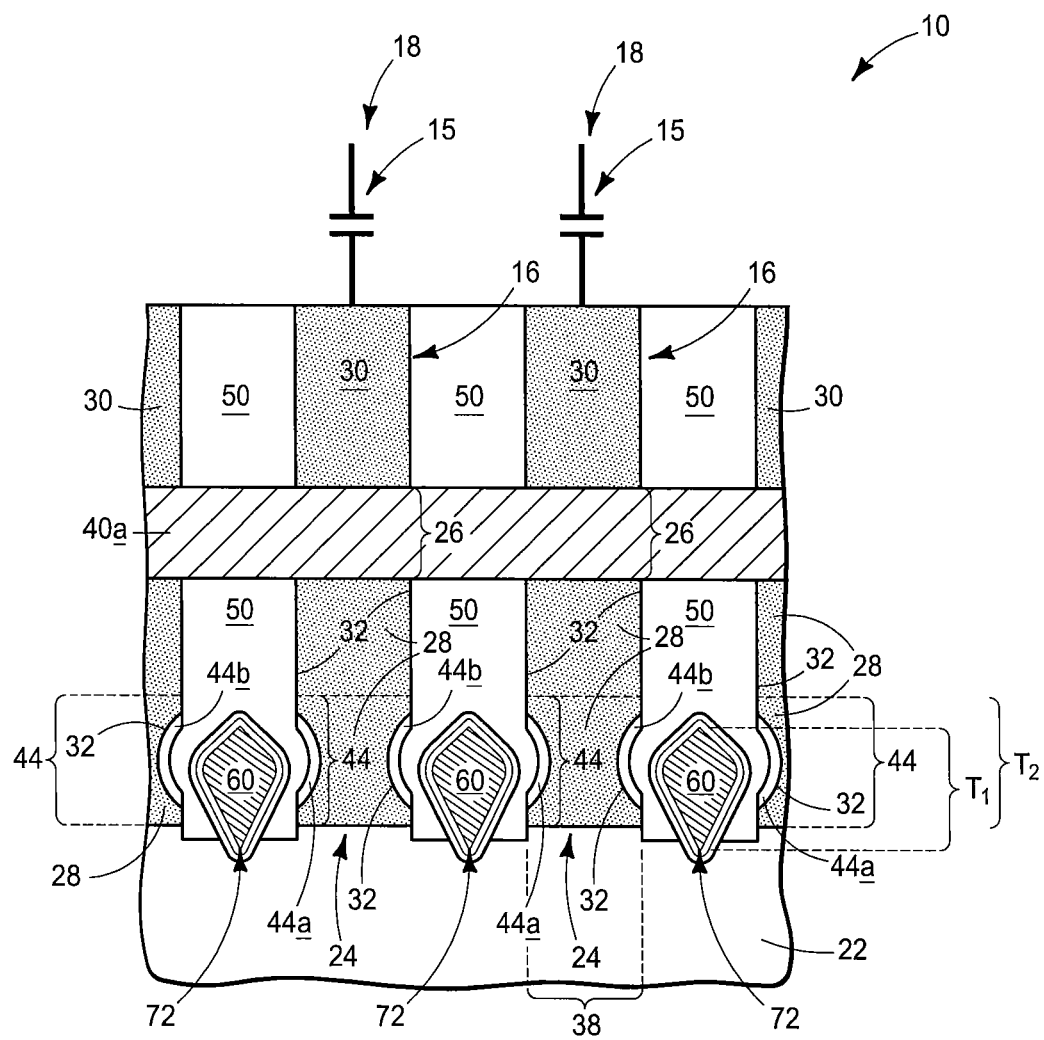
FIG. 3 is a hybrid schematic and structural cross-sectional view taken through line 3-3 in FIG. 1.

Substrate fragment 10 comprises substrate material 22 which may be homogenous or non-homogenous, and may comprise multiple different composition materials, regions, and/or layers. Example materials include semiconductor material, for example bulk monocrystalline silicon lightly background doped with a p-type conductivity-modifying impurity, SiGe, InGaAs, and/or composites of such materials. Other semiconductor materials, including semiconductor-on-insulator substrates, may also be used. In some embodiments and as shown, vertically-oriented transistors 16 are field-effect transistors. FIGS. 1-3 show individual transistors 16 as including semiconductor-comprising pedestals 24 having an elevationally outer source/drain region 30, an elevationally inner source/drain region 28, and a channel region 26 received elevationally between inner source/drain region 28 and outer source/drain region 30. Each may be homogenous or non-homogenous, with suitably doped semiconductor material (e.g., monocrystalline silicon) being examples. Specifically, inner and outer source/drain regions 28, 30, respectively, may comprise highest-doped concentration portions which are suitably conductively doped with one type of conductivity-modifying impurity, wherein channel region 26 may be doped with a lower concentration of an opposite type impurity. Each region 28 and/or 30 may include one or more of same-type lightly doped regions (e.g., LDD) and of opposite-type doped halo regions (neither of which is specifically designated nor shown). Regardless, individual charge storage devices 15 may electrically couple to respective outer source/drain regions 30. In the context of this document, devices or components are electrically coupled relative one another if electric current continuously flows from one to the other predominately by movement of subatomic positive and/or negative charges when such are sufficiently generated as opposed to predominately by movement of ions. Inner source/drain regions 28 may be considered as having opposing laterally outer sides 32 (FIG. 3). Further, channel regions 26 may be considered as having opposing laterally outer sides 34 (FIG. 2), and in one embodiment which are transversely oriented relative to sides 32 of inner source/drain regions 28.

Array 12 includes rows 36 of access lines and columns 38 of data/sense lines (FIG. 1). Use of "rows" and "columns" in this document is for convenience in distinguishing a series of access lines from a series of data/sense lines. Accordingly, "rows" and "columns" are intended to be synonymous with a series of access lines and a series of data/sense lines, respectively. The rows may be straight and/or curved and/or parallel and/or unparallel relative one another, as may be the columns. Further, the columns and rows may intersect relative one another at 90° or at one or more other angles. In the depicted example, each of the rows and columns are shown as being individually straight and angling relative one another at 90°.

Individual rows comprise an access line which interconnects transistors in that row. One access line or multiple access lines may be used which interconnect transistors in that row. Where multiple access lines are used, such lines may be electrically coupled relative one another. FIGS. 1-4 show individual rows 36 as comprising a pair of access lines 40a, 40b. In one embodiment and as shown, the access lines also form gates for individual field effect transistors, and therefore in some embodiments comprise access gate lines. One of the pair of access lines 40a, 40b is operatively laterally over one of laterally outer sides 34 of channel region 26, with the other of the pair of gate lines 40a, 40b being operatively laterally over the other of laterally outer sides 34 of channel region 26. A gate dielectric 42 is provided laterally between individual access gate lines 40a, 40b and respective channel regions 26. Access lines 40a, 40b may be homogenous or non-homogenous, may be of the same composition or of different compositions relative one another, and will comprise any suitably conductive material (s), for example any one or more of elemental metals, an alloy of elemental metals, a conductive metal compound, and conductively doped semiconductor material(s). Access lines 40a, 40b are shown to be rectangular in cross section, although any shape may be used. Further, each need not be of the same shape relative the other. Access lines 40a, 40b and gate dielectric 42 are shown as being laterally recessed relative to laterally outermost sides of source/drain regions 28, 30. Alternately, as another example, access lines 40a, 40b and gate dielectric 42 may be received laterally outward of the sides of source/drain regions 28, 30, for example which might simplify fabrication and/or be used to impact operation of transistors 16.

Access lines 40a, 40b within individual rows 36 may be electrically coupled relative one another, for example as shown schematically via respective interconnects 41 (FIG. 1). As an alternate example, gate dielectric may be received circumferentially about the channel regions (not shown), with the access line in a single row encircling that gate dielectric and running continuously as a single access line in the individual rows (not shown).

Figure 4:
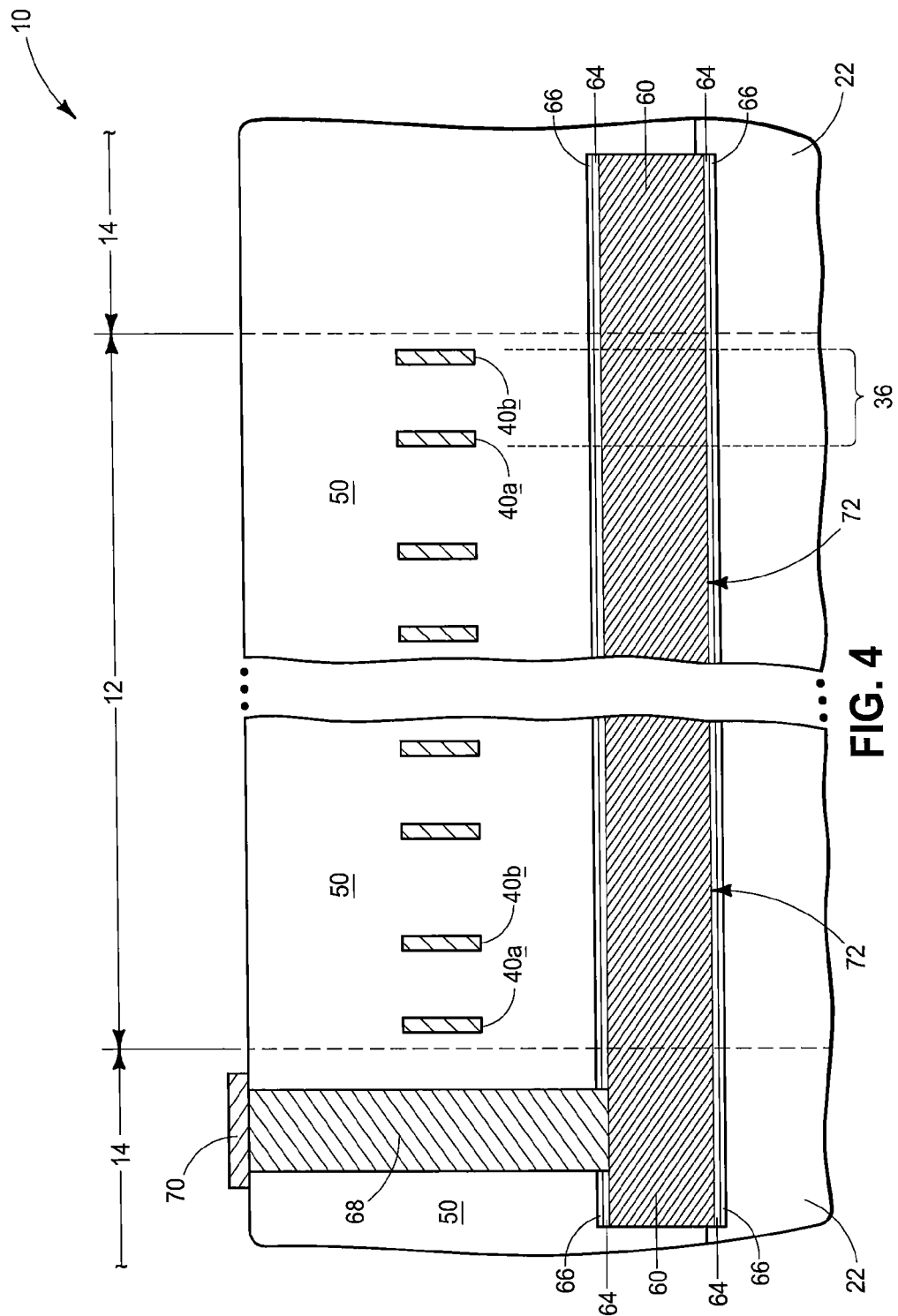
FIG. 4 is a structural cross-sectional view taken through line 4-4 in FIG. 1.
Figure 5:
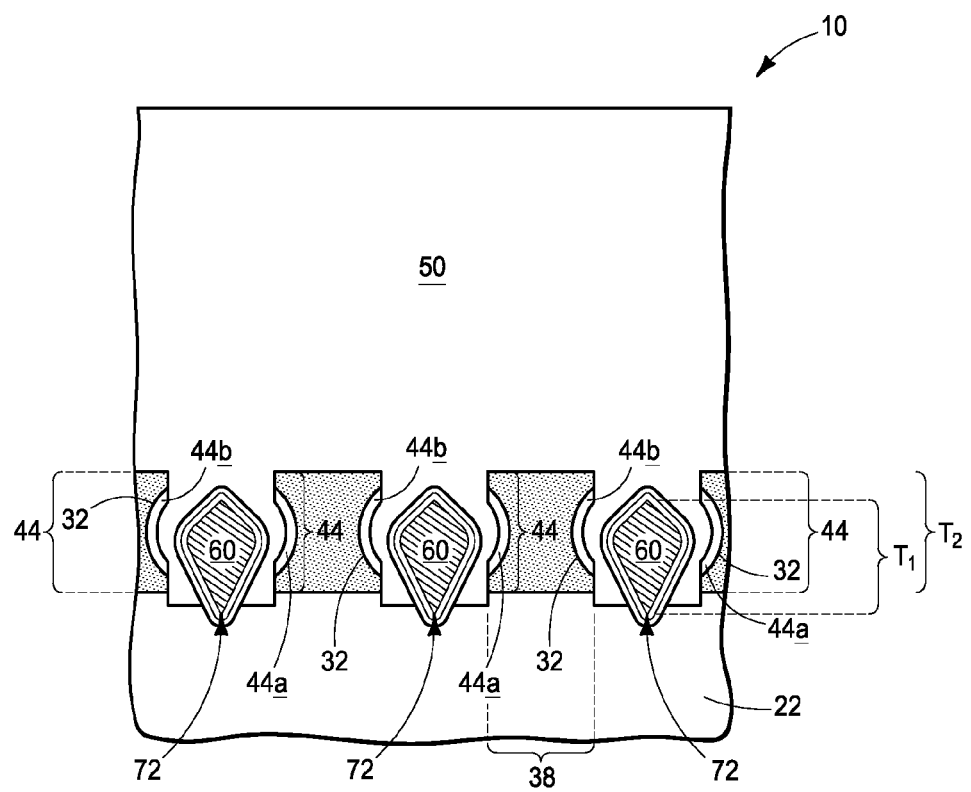
FIG. 5 is a structural cross-sectional view taken through line 5-5 in FIG. 1.

Individual columns comprise an inner data/sense line elevationally inward of the access lines and which interconnects transistors in that column. One data/sense line or multiple data/sense lines may be used elevationally inward of the access lines for interconnecting transistors in that column. FIGS. 1-5 show individual columns 38 as comprising data/sense lines 44 elevationally inward of access lines 40a, 40b. In one embodiment and as shown, the elevationally inner source/drain regions 28 are continuously connected in individual columns 38 to comprise at least part of the data/sense line in that column (FIG. 2). Alternately as an example, inner source/drain regions 28 might not be so connected. Regardless, in one embodiment and as shown, a pair of conductive lines 44a, 44b form a part of data/sense lines 44 (FIGS. 1, 3, and 5). One of the pair of lines 44a, 44b is shown electrically coupled to and against one of laterally outer sides 32 of inner source/drain regions 28, and the other of the pair of lines 44a, 44b is electrically coupled to and against the other of laterally outer sides 32 of inner source/drain regions 28. Lines 44a and 44b may be electrically coupled to one another other than solely through inner source/drain regions 28, for example as shown schematically via respective interconnects 45 (FIG. 1). Lines 44a, 44b may be homogenous or non-homogenous, and may be of the same composition or of different compositions relative one another. Example materials include those described above for access lines 40a, 40b. Lines 44a, 44b are shown to be arcuate and concave in cross-section, although any shape may be used. Further, each need not be of the same shape relative the other. One or more lines 44a/44b may be formed of material of higher conductivity than conductively doped inner source/drain regions 28. Data/sense lines 44 may be fabricated to not include one or both of lines 44a/44b. Example total n-type dopant concentration for the highest conductive portions of inner source/drain regions 28 and the semiconductor material portions of data/sense lines 44 is at least $5 \times 10^{19}$ atoms/cm$^3$. Example p-type dopant concentration for channel region 26 is about $1 \times 10^{18}$ atoms/cm$^3$.

Individual columns may comprise one or more outer data/sense lines (not shown) elevationally outward of the access lines and which electrically couple(s) to the inner data/sense line in that column, for example as disclosed in U.S. patent application Ser. No. 13/413,402 filed on Mar. 6, 2012, naming Lars P. Heineck and Jonathan T. Doebler as inventors, and entitled "Arrays Of Vertically-Oriented Transistors, Memory Arrays Including Vertically-Oriented Transistors, And Memory Cells". Such constructions may lower the overall resistance of the data/sense lines to sense amplifiers external of the array. Additionally, such constructions may lower the ratio of data/sense line-to-data/sense line capacitance to data/sense line-to-world capacitance, thus perhaps improving the final signal delivered to individual sense amplifiers.

Dielectric material 50 is received about transistors 16, including access lines 40a, 40b, data/sense lines 44, and semiconductor-comprising pedestals 24. Dielectric material 50 may be homogenous or non-homogenous, with silicon nitride and boron and/or phosphorous-doped silicon dioxide being examples. Access gate lines 40a, 40b are shown with diagonal hatching for distinguishing clarity in FIG. 1, although such are received within dielectric material 50 as shown in FIGS. 2-4. Semiconductor-comprising pedestals 24 are diagrammatically shown as having vertical, straight, and aligned sidewalls. However, such may not be so-provided and may for example include arcuate and/or angled portions regardless of any alignment.

Figure 6:
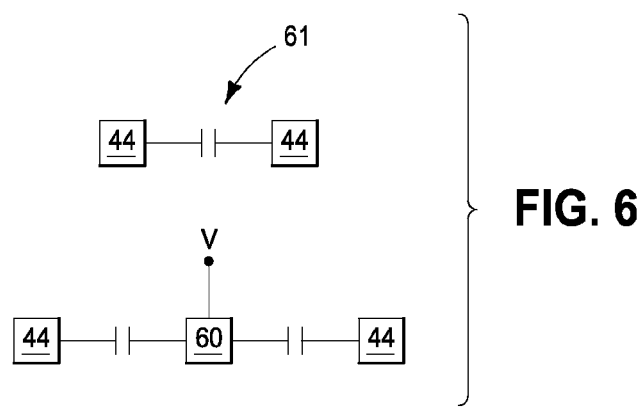
FIG. 6 shows two schematic diagrams.

Array 12 includes a plurality of conductive lines 60 which individually extend longitudinally parallel and laterally between immediately adjacent data/sense lines 44 (FIGS. 1, 3, and 5). Example materials include those described above with respect to access lines 40a, 40b. Individual conductive lines 60 may be electrically coupled to a suitable potential to at least reduce parasitic capacitance and/or cross-talk between immediately adjacent of the data/sense lines. For example, FIG. 6 diagrammatically shows two schematics of a pair of immediately adjacent data/sense lines 44. The top schematic shows no conductive line there-between or perhaps a conductive-line there-between (not shown) whose voltage is allowed to float as opposed to being provided to a suitable potential. Parasitic capacitance between adjacent data/sense lines 44 is shown by a capacitor 61. In the bottom schematic, a conductive line 60 is shown between immediately adjacent data/sense lines 44. When provided at a suitable potential V, line 60 will at least reduce one or both of parasitic capacitance and/or cross-talk between immediately adjacent data/sense lines 44 and may eliminate such capacitance and/or cross-talk. The artisan will be able to select suitable positive, negative, and/or ground voltages which may be constant or varied in operation to achieve such effect(s).

In one embodiment, the individual conductive lines are electrically coupled to one another, although in other embodiments such may not be so coupled. Regardless, FIGS. 3-5 show an embodiment wherein individual conductive lines 60 are encircled by dielectric material at least within array 12. That dielectric material may be homogenous or non-homogenous, with two different composition dielectric materials 64, 66 being shown. In one embodiment, one of materials 64 and 66 comprises silicon dioxide and the other comprises silicon nitride. Individual conductive lines 60 in the FIGS. 1-5 embodiment are shown as being electrically coupled to one another proximate at least one of their respective ends by vias 68 extending through dielectrics 64, 66, and 50 to an overlying conductive line 70. Vias 68 and line 70 may be provided at the other ends of lines 60 alternately or additionally (not shown). In one embodiment, the individual access lines are oriented parallel one another, with the individual conductive lines being electrically coupled to one another by a conductive line that is oriented parallel the access lines (e.g., line 70 as shown). Other manners of electrical coupling may be used, for example as are described below. Alternately, construction may be provided (not shown) whereby individual conductive lines are not electrically coupled and may be separately controlled.

Figure 7:
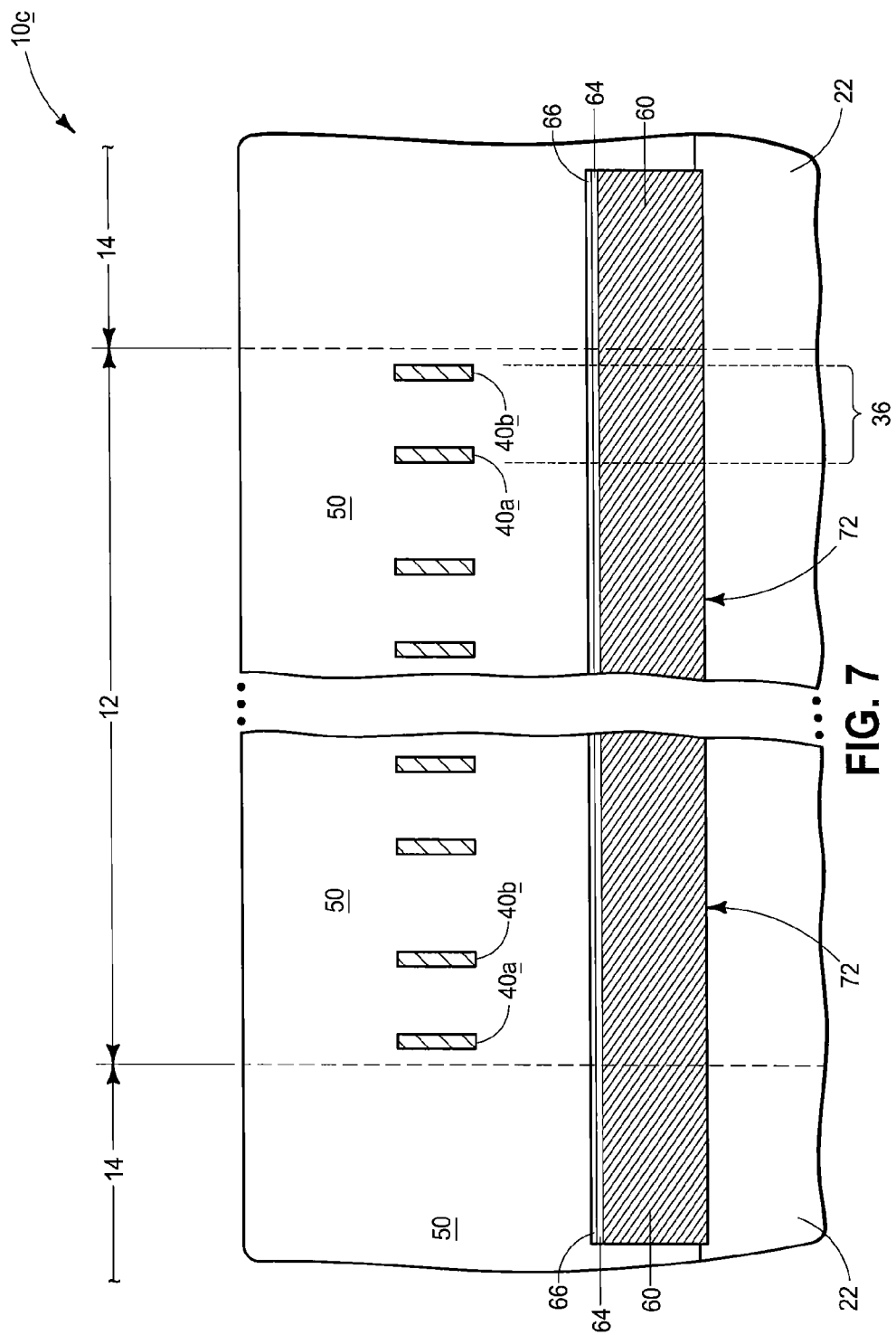
FIG. 7 is a structural cross-sectional view of a substrate fragment comprising an array in accordance with an alternate embodiment of the invention, and corresponds in position to the cross-section of the FIG. 4 substrate fragment.

Individual conductive lines 60 may be considered as having respective bases 72. In FIGS. 3-5, bases 72 are everywhere separated from underlying semiconductor material 22 by dielectric material 64/66. Alternately, individual conductive lines 60 may have their respective bases 72 directly against and electrically coupled to underlying semiconductor material 22, for example as shown with respect to a substrate fragment 10c in FIG. 7. Like numerals from the above described embodiments have been used where appropriate. FIG. 7 is an alternate embodiment to that depicted by FIG. 4 of the FIGS. 1-5 embodiments. In FIG. 7, dielectric 64/66 is not received over respective bases 72 whereby bases 72 are directly against and electrically coupled to underlying semiconductor material 22 continuously lengthwise along individual conductive lines 60 (i.e., over at least a majority of their respective lengths within array 12). In this document, a material or structure is "directly against" another when there is at least some physical touching contact of the stated materials or structures relative one another. In contrast, "over", "on", and "against" not preceded by "directly", encompass "directly against" as well as constructions where intervening material(s) or structure(s) result(s) in no physical touching contact of the stated materials or structures relative one another. Vias 68 and 70 (not shown) might not be used in the embodiment of FIG. 7.

Figure 8:
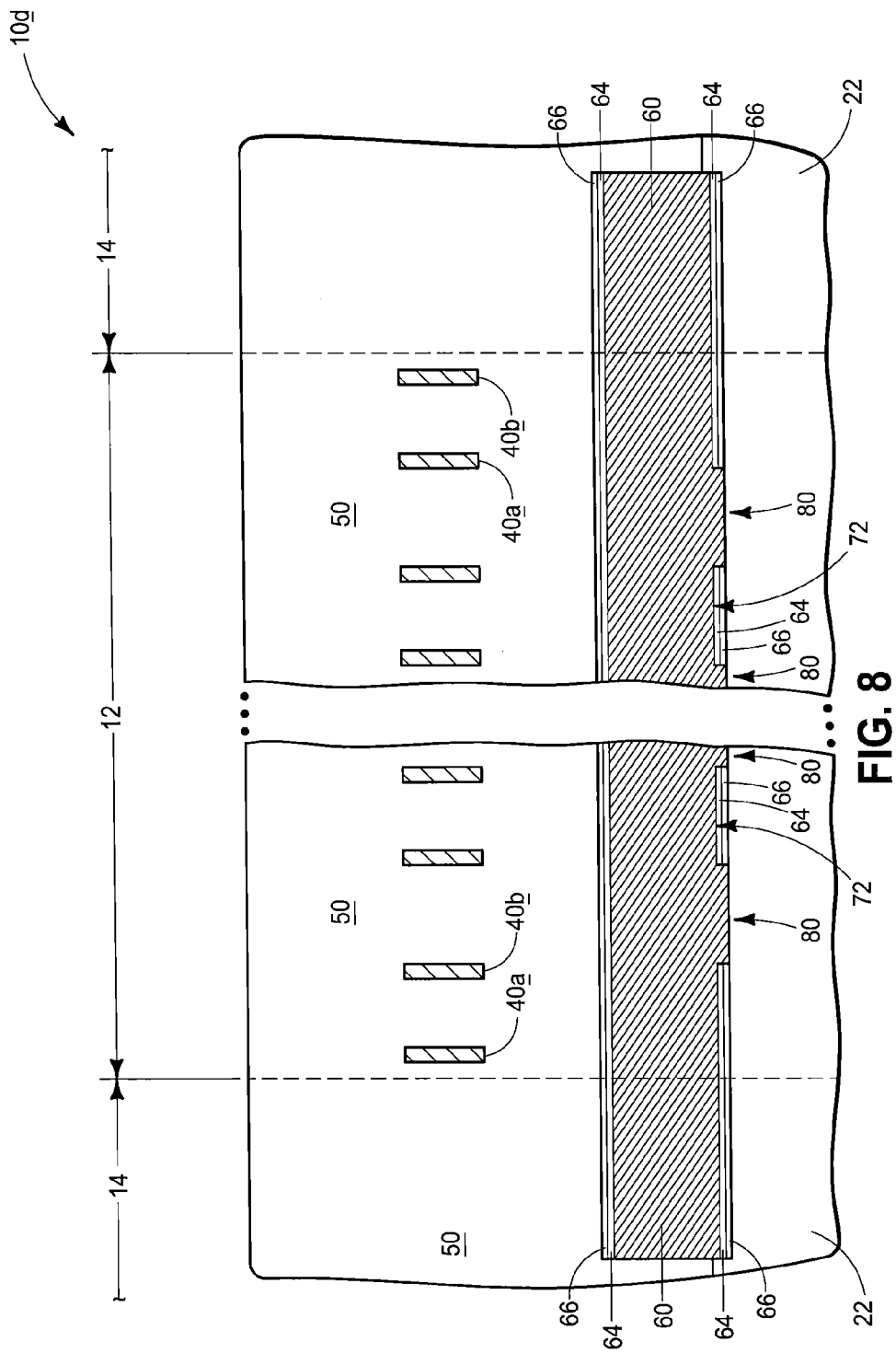
FIG. 8 is a structural cross-sectional view of a substrate fragment comprising an array in accordance with an alternate embodiment of the invention, and corresponds in position to the cross-section of the FIG. 4 substrate fragment.

As an alternate example, the bases may be directly against and electrically coupled to the underlying semiconductor material at multiple spaced locations paralleling lengthwise along the individual conductive lines. One such example embodiment is shown with respect to a substrate fragment 10*d* in FIG. 8. Like numerals from the above described embodiments have been used where appropriate, with some construction differences being indicated with the suffix "d" or with different numerals. In FIG. 8, conductive bases 72 of conductive lines 60 are directly against underlying semiconductor material 22 at spaced locations 80. In one embodiment and as shown, spaced locations 80 are paralleling between the vertically-oriented transistors 16, and in one embodiment are paralleling between each of vertically-oriented transistors 18 lengthwise along the individual conductive lines. Spaced locations 80 may be alternately located.

In the example FIGS. 7 and 8 embodiments, the individual conductive lines may effectively be electrically coupled to one another by the underlying substrate material 22 which may be provided at a suitable potential to, for example, at least reduce parasitic capacitance and/or cross-talk between immediately adjacent of the data/sense lines.

Figure 9:
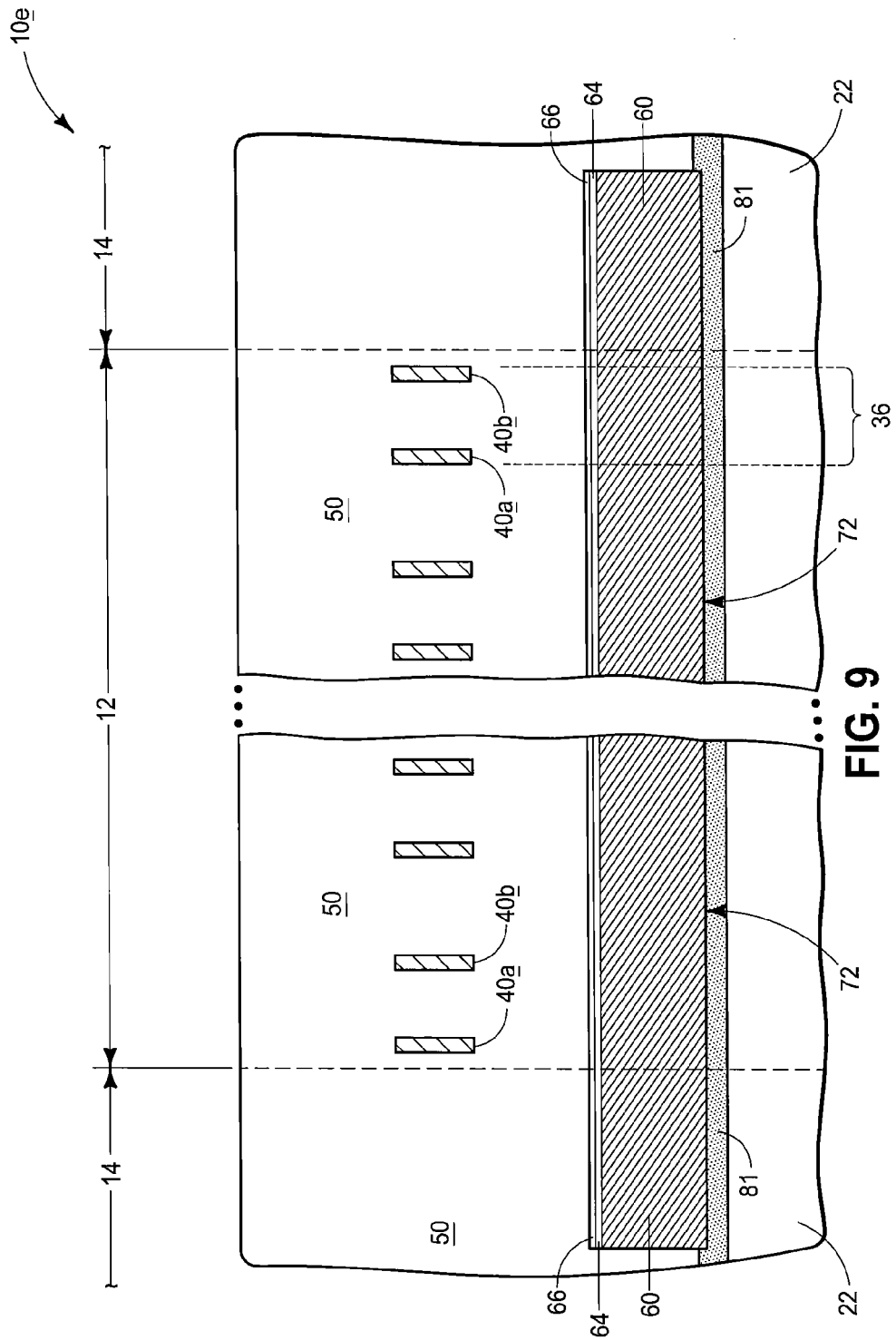
FIG. 9 is a structural cross-section view of a substrate fragment comprising an array in accordance with an alternate embodiment of the invention, and corresponds in position to the cross-section of the FIG. 4 substrate fragment.

In one embodiment, the semiconductor material underlying the bases may be provided to have a higher doped region that is elevationally over a lower doped region (e.g., background doping of the semiconductor material), with the bases being directly against the higher doped region. This may, for example, facilitate electrically coupling of the conductive lines with the underlying semiconductor material. For example, FIG. 9 shows such an alternate embodiment substrate fragment 10*e*. Like numerals from the FIG. 7 embodiment have been used where appropriate, with some construction differences being indicated with the suffix "e" or with different numerals. In FIG. 9, semiconductor material 22 comprises a higher doped region 81 which is elevationally over remainder of semiconductor material 22 (i.e., region 81 is elevationally over a lower doped region of material 22), with bases 72 being directly against higher doped region 81. A higher doped region may also be used with respect to the embodiment of FIG. 8, and regardless of whether a higher doped region is continuous in respective lines across the array or are only directly beneath the depicted openings in dielectric 64/66 at locations 80.

Conductive lines 60 may be considered as comprising elevational thicknesses $T_1$, and data sense lines 44 may be considered as comprising elevational thicknesses $T_2$ (FIGS. 3 and 5). Thicknesses $T_1$ may be the same for individual conductive lines 60 or may be different for different lines. Additionally or alternatively, $T_1$ may be constant or may be variable within a single individual conductive line 60. If variable, $T_1$ refers to an average elevational thickness of an individual conductive line 60. Likewise, thicknesses $T_2$ for individual data/sense lines 44 may be the same or different. Additionally or alternatively, $T_2$ may be constant or may be variable within a single data sense line 44. If variable, $T_2$ refers to an average elevational thickness of an individual data/sense line 44. Regardless, in one embodiment and as shown with respect to the embodiment of FIGS. 3-5, individual conductive lines 60 extend elevationally inward relative to their immediately adjacent data/sense lines 44 (i.e., $T_1$ extends lower than does $T_2$).

Figure 10:
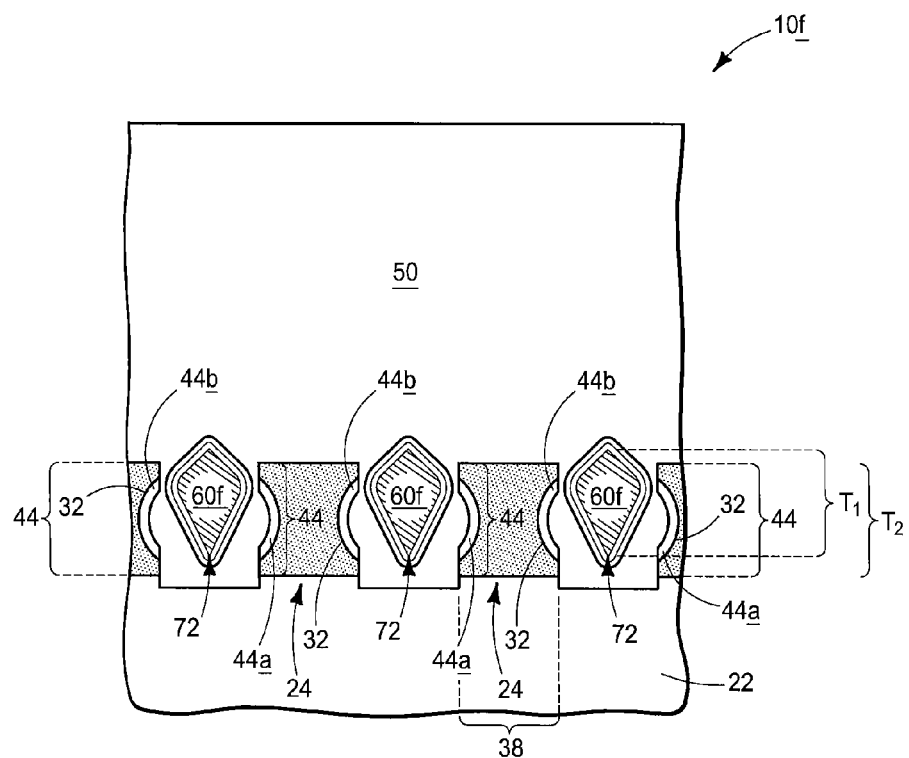
FIG. 10 is a structural cross-section view of a substrate fragment comprising an array in accordance with an alternate embodiment of the invention, and corresponds in position to the cross-section of the FIG. 5 substrate fragment.

FIGS. 3-5 also show an example embodiment wherein conductive lines 60 do not extend elevationally outward relative to their immediately adjacent data/sense lines 44. FIG. 10 shows an alternate embodiment substrate fragment 10*f* wherein individual conductive lines 60*f* extend elevationally outward relative to their immediately adjacent data/sense lines 44. Like numerals from the above described embodiments have been used where appropriate, with some construction differences being indicated with the suffix "f". FIG. 10 also shows an example embodiment wherein individual conductive lines 60 do not extend elevationally inward relative to their immediately adjacent data/sense lines 44.

Figure 11:
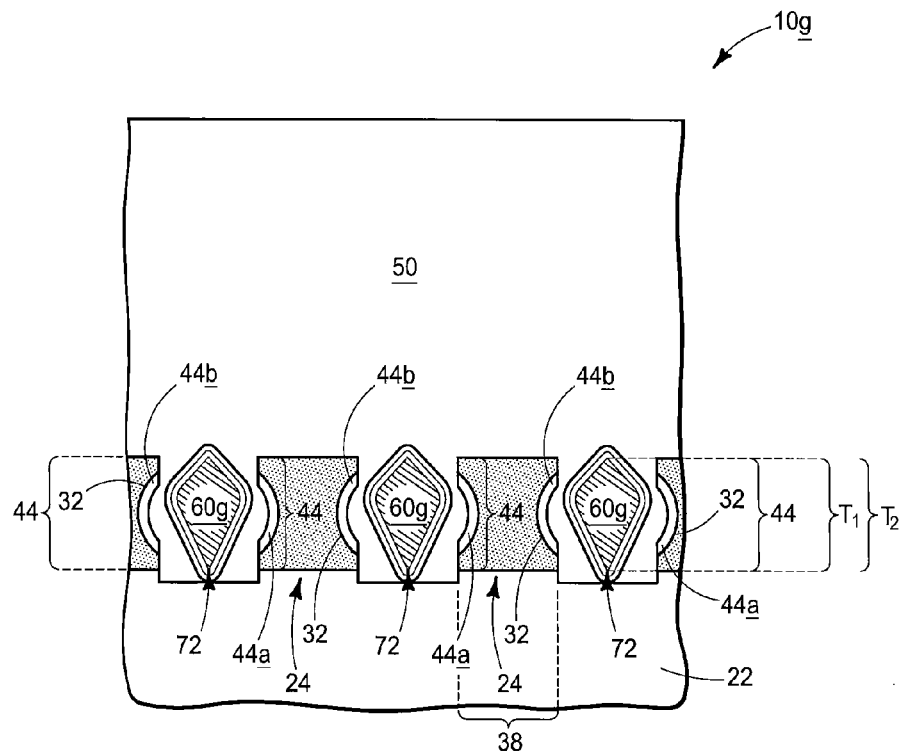
FIG. 11 is a structural cross-sectional view of a substrate fragment comprising an array in accordance with an alternate embodiment of the invention, and corresponds in position to the cross-section of the FIG. 4 substrate fragment.

FIG. 11 shows an alternate embodiment substrate fragment 10*g* wherein conductive lines 60*g* have respective elevational thicknesses that span all of the elevational thicknesses of their immediately adjacent data/sense lines. FIG. 11 also shows an example embodiment wherein individual conductive lines 60 have respective elevational thicknesses $T_1$ that are elevationally coincident with the elevational thicknesses $T_2$ of their immediately adjacent data/sense lines 44. Like numerals from the above described embodiments have been used where appropriate, with some construction differences being indicated with the suffix "g".

Figure 12:
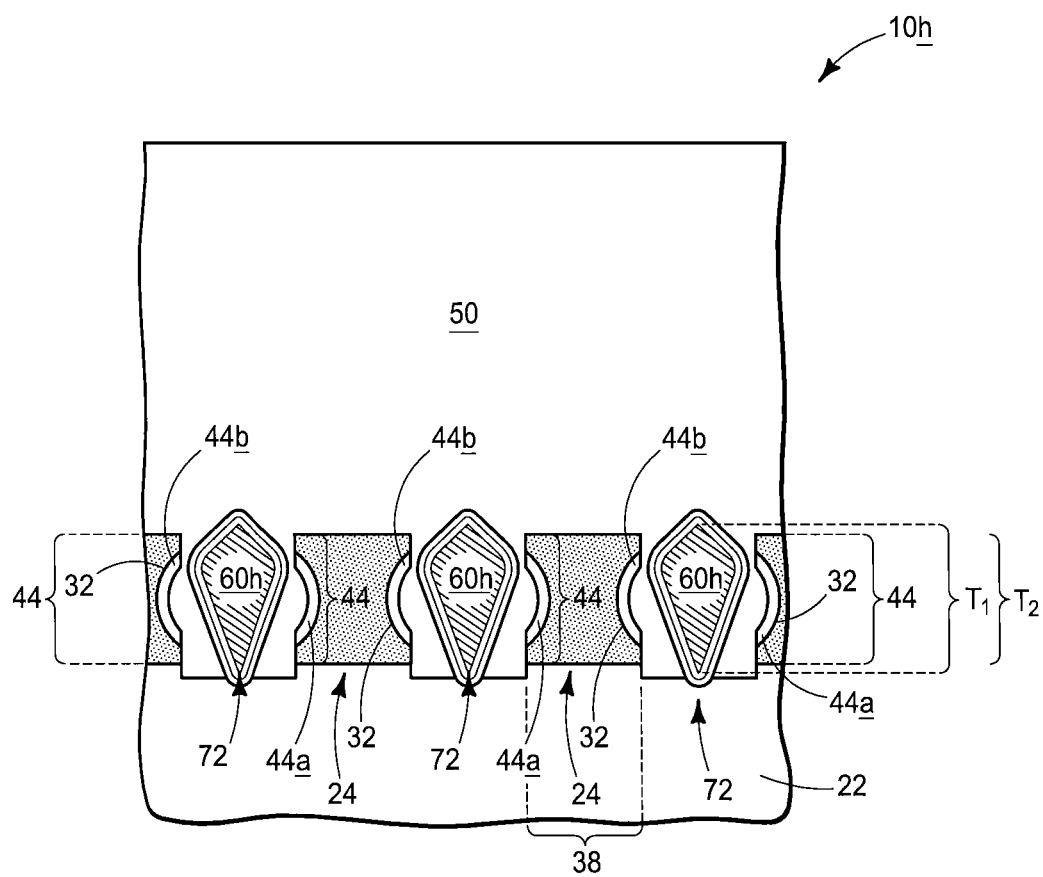
FIG. 12 is a structural cross-sectional view of a substrate fragment comprising an array in accordance with an alternate embodiment of the invention, and corresponds in position to the cross-section of the FIG. 4 substrate fragment.

FIG. 12 shows an alternate embodiment substrate fragment 10*h* wherein individual conductive lines 60*h* extend elevationally inward and outward relative to their immediately adjacent data/sense lines 44. Like numerals from the above described embodiments have been used where appropriate, with some construction differences being indicated with the suffix "h".

Any of the embodiments of FIGS. 10-12 may include any of the features shown and described with respect to FIGS. 1-9, or otherwise.

Structures in accordance with embodiments of the invention may be fabricated using any existing or yet-to-be-developed techniques. For example, processing may occur at least in part as described in any one or more of U.S. patent application Ser. No. 12/917,346 filed on Nov. 1, 2010, naming Lars P. Heineck and Jaydip Guha as inventors, and entitled "Memory Cells, Arrays Of Memory Cells, And Methods Of Forming Memory Cells" (now U.S. Patent Publication No. 2012/0104491 A1); U.S. patent application Ser. No. 13/031,829 filed on Feb. 22, 2011, naming Jaydip Guha, Shyam Surthi, Suraj J. Mathew, Kamal M. Karda, and Hung-Ming Tsai as inventors, and entitled "Methods Of Forming A Vertical Transistor And At Least A Conductive Line Electrically Coupled Therewith, Methods Of Forming Memory Cells, And Methods Of Forming Arrays Of Memory Cells" (now U.S. Patent Publication No. 2012/0214285 A1); and U.S. patent application Ser. No. 13/413,402 filed on Mar. 6, 2012, naming Lars P. Heineck and Jonathan T. Doebler as inventors, and entitled "Arrays Of Vertically-Oriented Transistors, Memory Arrays Including Vertically-Oriented Transistors, And Memory Cells" (now U.S. Patent Publication No. 2013/0235642 A1).

Further and regardless, conductive lines 60 may be fabricated in any of a number of manners. As an example, consider in one embodiment that the sidewalls of openings within which dielectric material 50 is formed may not be vertical as shown. For example, such may be formed by etching into semiconductor material and which taper to be narrower at their bottoms than at their tops. Such openings may also and/or alternately be fabricated whereby they neck laterally inward at or near the tops of where lines 60 will be and then widen laterally outward deeper into the substrate. Deposition of dielectric material 64/66 may be conducted whereby sealed longitudinal tube-like or pipe-like void spaces are created where conductive material of conductive lines 60 will be received. In one possible technique, these individual tubes could subsequently be opened at their tops, and thereafter filled with conductive material 60. That conductive material could then be recessed inwardly to the top of the former tubes and subsequently sealed with dielectric material. The access devices would be formed thereover, followed by formation of vias 68 and conductive lines 70. As an alternate example, after opening the tops of the formerly sealed tubes, the dielectric bottom surfaces thereof may be etched continuously or at spaced locations in forming either of the embodiments of FIG. 7 or FIG. 8 prior to deposition of the conductive material to be used for conductive lines 60.

As a further alternate example, no sealed tube-like or sealed pipe-like voids might be created. For example, upwardly open trenches between immediately adjacent digit lines may be formed. Sidewalls and bases thereof may be covered with dielectric material in a manner which does not form sealed, tube-like voids therein, whereby the trenches remain upwardly open. That dielectric material could subsequently be anisotropically etched from the bases to expose underlying semiconductor material 22 in forming one of the constructions of FIG. 7 or FIG. 8. Sidewalls thereof may remain covered by the dielectric material. Conductive material could be subsequently deposited, recessed back, capped with dielectric, and then followed by formation of the access lines.

Regions 81, where used, could be formed at any suitable time during manufacture.

Figure 13:
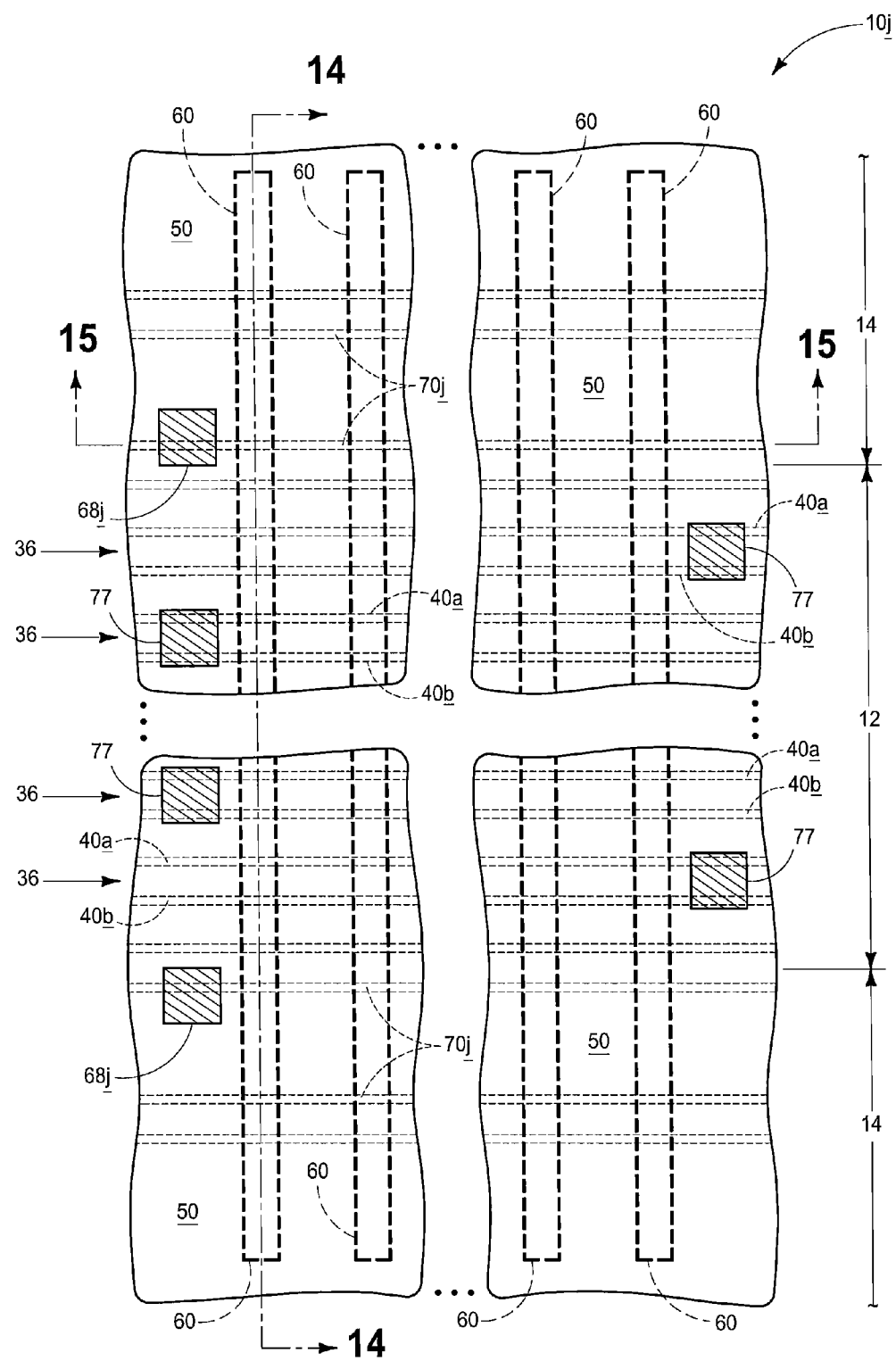
FIG. 13 is a diagrammatic, fragmented, top plan view of a substrate fragment comprising an array in accordance with an embodiment of the invention, and which comprises vertically-oriented transistors.
Figure 14:
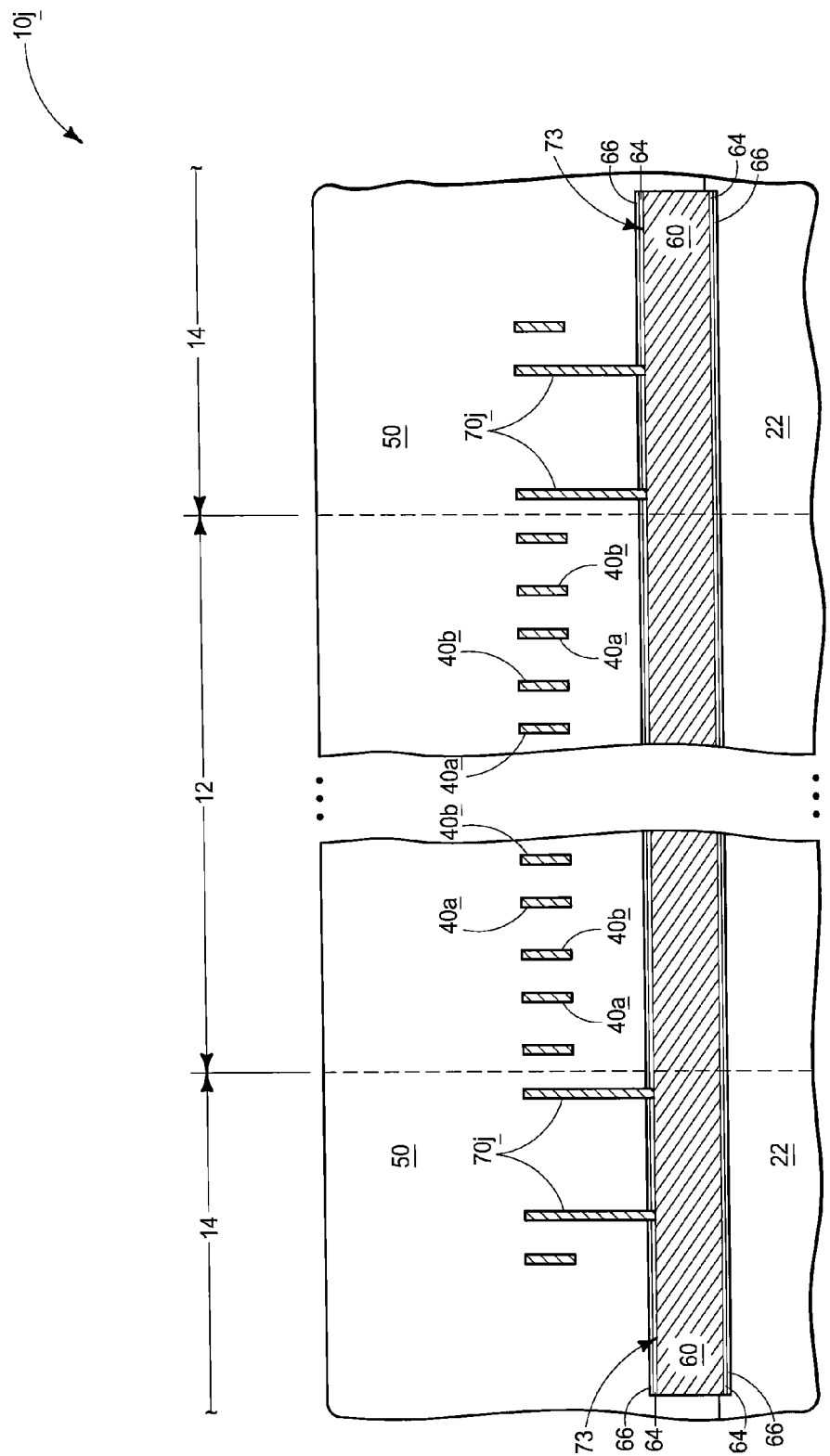
FIG. 14 is a structural cross-sectional view taken through line 14-14 in FIG. 13.
Figure 15:
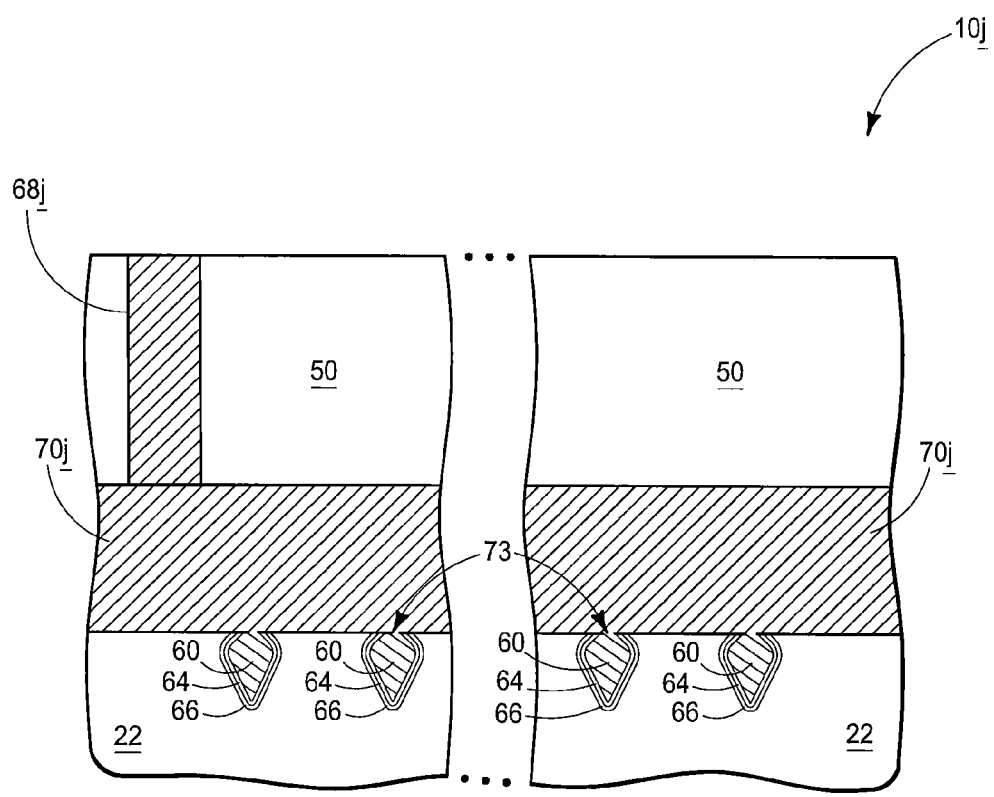
FIG. 15 is a structural cross-sectional view taken through line 15-15 in FIG. 13.

FIGS. 13-15 show an alternate embodiment substrate fragment 10*j*. Like numerals from the above described embodiments have been used where appropriate, with some construction differences being indicated with the suffix "j". Semiconductor pedestals 24 and data sense lines 44 are not shown in FIG. 13 for simplification and clarity, although such may be included analogously to that shown and described above with respect to the top view of FIG. 1. Individual conductive lines 60 may be considered as having respective tops 73. A conductive line 70*j* electrically couples individual conductive lines 60 to one another, with line tops 73 being directly against conductive line 70*j*. A conductive via 68*j* may electrically couple with conductive line 70*j* and extend elevationally outward there-from. In one embodiment, the individual access lines are oriented parallel one another, with conductive line 70*j* being oriented parallel the access lines. In one embodiment, at least two conductive lines 70*j* electrically couple conductive lines 60 to one another. In one embodiment, two conductive lines 70*j* are oriented parallel access lines 40*a*, 40*b*, and in one embodiment as shown are proximate opposing ends of array rows 36.

The structure of FIGS. 13-15 may be fabricated easier than some of the other above-described embodiments. For example, providing a wider gap at an end of an array of access lines than gap width between the access lines within the array may inherently result in trench-etching deeper at the end of the array during a reactive ion etch of dielectric material 50. This may enable fabrication of conductive line(s) 70*j* at the same time as forming access lines 40*a*, 40*b*. For example, the deeper trench(es) at the end of the array as opposed to within the array will enable conductive line(s) 70*j* to extend inwardly to connect with conductive lines 60. Accordingly, the conductive material of access lines 40*a*, 40*b* and that of conductive line(s) 70*j* may be deposited at the same time. Further, conductive via(s) 68*j* may be formed concurrently with the forming of example conductive contacts 77 that electrically couple with individual access line pairs 40*a*, 40*b*.

The above-described structures may be fabricated to any suitable architecture or size. In one example, individual memory cells of the above architecture may have $4F^2$ horizontally occupied area, where "F" is the minimum lateral feature dimension of the smallest feature that is formed using feature edges of a mask pattern that is received elevationally outward of material from which such smallest features are formed.

CONCLUSION

In some embodiments, an array comprises vertically-oriented transistors. The array comprises rows of access lines and columns of data/sense lines. Individual of the rows comprise an access line interconnecting transistors in that row. Individual of the columns comprise a data/sense line interconnecting transistors in that column. The array comprises a plurality of conductive lines which individually extend longitudinally parallel and laterally between immediately adjacent of the data/sense lines.

In some embodiments, an array comprises vertically-oriented transistors. The array comprises rows of access lines and columns of data/sense lines. Individual of the rows comprise an access line interconnecting transistors in that row. Individual of the columns comprise a data/sense line interconnecting transistors in that column. The array includes a plurality of conductive lines individually extending longitudinally parallel and laterally between immediately adjacent of the data/sense lines. The individual conductive lines have respective bases that are everywhere separated from underlying semiconductor material by dielectric material. The individual conductive lines are electrically coupled to a suitable potential to at least reduce parasitic capacitance and/or cross-talk between immediately adjacent of the data/sense lines. The individual conductive lines are electrically coupled to one another proximate at least one or their respective ends.

In some embodiments, an array comprises vertically-oriented transistors. The array comprises rows of access lines and columns of data/sense lines. Individual of the rows comprise an access line interconnecting transistors in that row. Individual of the columns comprise a data/sense line interconnecting transistors in that column. The array comprises a plurality of conductive lines individual extending longitudinally parallel and laterally between immediately adjacent of the data/sense lines. The individual conductive lines have respective bases that are directly against and electrically coupled to underlying semiconductor material at multiple spaced locations paralleling lengthwise along the individual conductive lines. The underlying substrate material is provided at a suitable potential to at least reduce parasitic capacitance and/or cross-talk between immediately adjacent of the data/sense lines.

In some embodiments, an array comprises vertically-oriented transistors. The array comprises rows of access lines and columns of data/sense lines. Individual of the rows comprise an access line interconnecting transistors in that row. Individual of the columns comprise a data/sense line interconnecting transistors in that column. The array comprises a plurality of conductive lines individually extending longitudinally parallel and laterally between immediately adjacent of the data/sense lines. The individual conductive lines have respective bases that are directly against and electrically coupled to underlying semiconductor material continuously lengthwise along the individual conductive lines. The underlying substrate material is provided at a suitable potential to at least reduce parasitic capacitance and/or cross-talk between immediately adjacent of the data/sense lines.

In some embodiments, an array comprises vertically-oriented transistors. The array comprises rows of access lines and columns of data/sense lines. Individual of the rows comprise an access line interconnecting transistors in that row. Individual of the columns comprise a data/sense line interconnecting transistors in that column. The array comprises a plurality of conductive lines individually extending longitudinally parallel and laterally between immediately adjacent of the data/sense lines. The individual conductive lines have respective tops that are directly against and electrically coupled to a conductive line which electrically couples the individual conductive lines to one another. The conductive line which electrically couples the individual conductive lines to one another is provided at a suitable potential to at least reduce parasitic capacitance and/or cross-talk between immediately adjacent of the data/sense lines.

In compliance with the statute, the subject matter disclosed herein has been described in language more or less specific as to structural and analytical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array comprising vertically-oriented transistors, the array comprising rows of access lines and columns of data/sense lines, the array comprising:
   individual of the rows comprising an access line interconnecting transistors in that row, the access lines comprising a gate of individual of the transistors, the individual transistors comprising a channel region, a gate dielectric being between the channel region and the gate of the individual transistors;
   individual of the columns comprising a data/sense line interconnecting transistors in that column; and
   a plurality of conductive lines, individual of the conductive lines extending longitudinally parallel and laterally between immediately adjacent of the data/sense lines, the individual conductive lines comprising four straight sides forming a four-major-sided polygon in a vertical cross-section, immediately adjacent of the straight sides joining in a single of four corner regions in the vertical cross-section, one of the four single corner regions being the sole elevationally outermost corner region of the respective individual conductive line in the vertical cross-section, another of the four single corner regions being opposite the one corner region in the vertical cross-section and being the sole elevationally innermost corner region of the respective individual conductive line in the vertical cross-section.

2. The array of claim 1 wherein the individual conductive lines are electrically coupled to one another.

3. The array of claim 1 wherein individual conductive lines are encircled by dielectric material within the array.

4. The array of claim 1 wherein semiconductor material underlies the individual conductive lines, the individual conductive lines have respective bases that are everywhere separated from the underlying semiconductor material by dielectric material.

5. The array of claim 4 wherein the dielectric material comprises a layer of silicon dioxide and a layer of silicon nitride.

6. An array comprising vertically-oriented transistors, the array comprising rows of access lines and columns of data/sense lines, the array comprising:
   individual of the rows comprising an access line interconnecting transistors in that row;
   individual of the columns comprising a data/sense line interconnecting transistors in that column; and
   a plurality of conductive lines, individual of the conductive lines extending longitudinally parallel and laterally between immediately adjacent of the data/sense lines, semiconductor material underlying the individual conductive lines, the individual conductive lines having respective bases that are directly against and electrically coupled to the underlying semiconductor material, the semiconductor material underlying the bases having a higher doped region elevationally over a lower doped region, the bases being directly against the higher doped region.

7. An array comprising vertically-oriented transistors, the array comprising rows of access lines and columns of data/sense lines, the array comprising:
   individual of the rows comprising an access line interconnecting transistors in that row;
   individual of the columns comprising a data/sense line interconnecting transistors in that column; and
   a plurality of conductive lines, individual of the conductive lines extending longitudinally parallel and laterally between immediately adjacent of the data/sense lines, semiconductor material underlying the individual conductive lines, the individual conductive lines having respective bases that are directly against and electrically coupled to the underlying semiconductor material, the bases being directly against and electrically coupled to the underlying semiconductor material at multiple spaced locations paralleling lengthwise along the individual conductive lines, dielectric material being elevationally between the bases and the underlying semiconductor material longitudinally between the multiple spaced locations along the individual conductive lines.

8. The array of claim 7 wherein the locations are between the vertically-oriented transistors.

9. The array of claim 7 wherein the locations are between each of the vertically-oriented transistors lengthwise along the individual conductive lines.

10. The array of claim 7 wherein the semiconductor material underlying the bases has a higher doped region elevationally over a lower doped region, the bases being directly against the higher doped region at the spaced locations.

11. An array comprising vertically-oriented transistors, the array comprising rows of access lines and columns of data/sense lines, the array comprising:
   individual of the rows comprising an access line interconnecting transistors in that row;
   individual of the columns comprising a data/sense line interconnecting transistors in that column; and
   a plurality of conductive lines, individual of the conductive lines extending longitudinally parallel and laterally between immediately adjacent of the data/sense lines, semiconductor material underlying the individual conductive lines, the individual conductive lines having respective bases that are directly against and electrically coupled to the underlying semiconductor material, the bases being directly against and electrically coupled to the underlying semiconductor material continuously lengthwise along the individual conductive lines, the semiconductor material underlying the bases having a higher doped region elevationally over a lower doped region, the bases being directly against the higher doped region continuously lengthwise along the individual conductive lines.

12. An array comprising vertically-oriented transistors, the array comprising rows of access lines and columns of data/sense lines, the array comprising:
   individual of the rows comprising an access line interconnecting transistors in that row;
   individual of the columns comprising a data/sense line interconnecting transistors in that column; and
   a plurality of conductive lines, individual of the conductive lines extending longitudinally parallel and laterally between immediately adjacent of the data/sense lines, the individual conductive lines extending vertically inward relative to their immediately adjacent data/sense lines.

13. An array comprising vertically-oriented transistors, the array comprising rows of access lines and columns of data/sense lines, the array comprising:
   individual of the rows comprising an access line interconnecting transistors in that row;
   individual of the columns comprising a data/sense line interconnecting transistors in that column; and
   a plurality of conductive lines, individual of the conductive lines extending longitudinally parallel and laterally between immediately adjacent of the data/sense lines, the individual conductive lines having respective tops that are vertically outward relative to their immediately adjacent data/sense lines.

14. An array comprising vertically-oriented transistors, the array comprising rows of access lines and columns of data/sense lines, the array comprising:
   individual of the rows comprising an access line interconnecting transistors in that row;
   individual of the columns comprising a data/sense line interconnecting transistors in that column; and
   a plurality of conductive lines, individual of the conductive lines extending longitudinally parallel and laterally between immediately adjacent of the data/sense lines, the individual conductive lines extending vertically inward and outward relative to their immediately adjacent data/sense lines.

15. An array comprising vertically-oriented transistors, the array comprising rows of access lines and columns of data/sense lines, the array comprising:
   individual of the rows comprising an access line interconnecting transistors in that row;
   individual of the columns comprising a data/sense line interconnecting transistors in that column; and
   a plurality of conductive lines, individual of the conductive lines extending longitudinally parallel and laterally between immediately adjacent of the data/sense lines, the individual conductive lines extending vertically inward relative to their immediately adjacent data/sense lines but not vertically outward relative to their immediately adjacent data/sense lines.

16. The array of claim 1 wherein the individual conductive lines have respective elevational thicknesses that span all of elevational thicknesses of their immediately adjacent data/sense lines.

17. The array of claim 16 wherein the individual conductive lines have respective elevational thicknesses that are elevationally coincident with the elevational thicknesses of their immediately adjacent data/sense lines.

18. An array comprising vertically-oriented transistors, the array comprising rows of access lines and columns of data/sense lines, the array comprising:
   individual of the rows comprising an access line interconnecting transistors in that row;
   individual of the columns comprising a data/sense line interconnecting transistors in that column; and
   a plurality of conductive lines, individual of the conductive lines extending longitudinally parallel and laterally between immediately adjacent of the data/sense lines, the individual conductive lines having respective elevational thicknesses that span all of elevational thicknesses of their immediately adjacent data/sense lines, the individual conductive lines extending vertically inward relative to their immediately adjacent data/sense lines.

19. An array comprising vertically-oriented transistors, the array comprising rows of access lines and columns of data/sense lines, the array comprising:
   individual of the rows comprising an access line interconnecting transistors in that row;
   individual of the columns comprising a data/sense line interconnecting transistors in that column; and
   a plurality of conductive lines, individual of the conductive lines extending longitudinally parallel and laterally between immediately adjacent of the data/sense lines, the individual conductive lines having respective elevational thicknesses that span all of elevational thicknesses of their immediately adjacent data/sense lines, the individual conductive lines extending vertically outward relative to their immediately adjacent data/sense lines.

20. The array of claim 1 wherein the array comprises a memory array comprising a charge storage device electrically coupled to a vertically outer source/drain region of individual of the vertically-oriented transistors.

21. The array of claim 1 wherein the individual vertically-oriented transistors include semiconductor-comprising pedestals which comprise a vertically outer source/drain region and an elevationally inner source/drain region, the elevationally inner source/drain regions being continuously connected in individual of the columns to comprise at least part of the data/sense line in individual of the columns.

22. An array comprising vertically-oriented transistors, the array comprising rows of access lines and columns of data/sense lines, the array comprising:
   individual of the rows comprising an access line interconnecting transistors in that row;
   individual of the columns comprising a data/sense line interconnecting transistors in that column; and
   a plurality of conductive lines, individual of the conductive lines extending longitudinally parallel and laterally between immediately adjacent of the data/sense lines, the individual conductive lines comprising four straight sides forming a four-major-sided polygon in a vertical cross-section, immediately adjacent of the straight sides joining in a single of four corner regions in the vertical cross-section, one of the four single corner regions being the sole elevationally outermost corner region of the respective individual conductive line in the vertical cross-section, another of the four single corner regions being opposite the one corner region in the vertical cross-section and being the sole elevationally innermost corner region of the respective individual conductive line in the vertical cross-section.

23. The array of claim 1 wherein the columns of the data/sense lines are vertically inward of the rows of the access lines.

24. The array of claim 22 wherein the individual conductive lines have a four-sided convex kite shape in the vertical cross-section defined by their four straight sides forming two distinct pairs of equal-length sides that are adjacent to each other.

25. The array of claim 1 wherein the individual conductive lines have a four-sided convex kite shape in the vertical cross-section defined by their four straight sides forming two distinct pairs of equal-length sides that are adjacent to each other.

\* \* \* \* \*